(12) United States Patent
Kim et al.

(10) Patent No.: US 6,992,346 B2
(45) Date of Patent: Jan. 31, 2006

(54) INTEGRATED CIRCUIT DEVICES WITH METAL-INSULATOR-METAL CAPACITORS

(75) Inventors: Ki-Chul Kim, Gyeonggi-do (KR); Young-Sun Kim, Gyeonggi-do (KR); Gab-Jin Nam, Seoul (KR); Sung-Tae Kim, Seoul (KR); Thomas Jongwan Kwon, Gyeonggi-do (KR); Han-Mei Choi, Seoul (KR); Jae-Soon Lim, Seoul (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/807,000

(22) Filed: Mar. 23, 2004

(65) Prior Publication Data

US 2004/0262661 A1 Dec. 30, 2004

(30) Foreign Application Priority Data

Jun. 26, 2003 (KR) ...................... 10-2003-0042171

(51) Int. Cl.
 *H01L 29/096* (2006.01)
(52) U.S. Cl. ...................................... 257/303; 257/306
(58) Field of Classification Search ................ 257/303, 257/306, 304
 See application file for complete search history.

(56) References Cited

U.S. PATENT DOCUMENTS 5,451,543 A * 9/1995 Woo et al. .................. 438/637
6,174,810 B1 * 1/2001 Islam et al. ................. 438/687
6,372,598 B2 4/2002 Kang et al.
6,468,858 B1 * 10/2002 Lou ........................... 438/253
6,500,763 B2 12/2002 Kim et al.
6,704,220 B2 * 3/2004 Leuschner .................. 365/173

FOREIGN PATENT DOCUMENTS

| JP | 2002-082940 | 3/2002 |
| KR | 1020020002756 | 1/2002 |
| KR | 1020020094462 | 12/2002 |

* cited by examiner

*Primary Examiner*—Ngân V. Ngô
*Assistant Examiner*—Thinh T Nguyen
(74) *Attorney, Agent, or Firm*—Myers Bigel Sibley & Sajovec PA

(57) ABSTRACT

A conductive contact plug extends through an opening in the dielectric layer to contact the substrate and includes a widened pad portion extending onto the dielectric layer adjacent the opening. An ohmic pattern is disposed on the pad portion of the plug, and a barrier pattern is disposed on the ohmic pattern. A concave first capacitor electrode is disposed on the barrier pattern and defines a cavity opening away from the substrate. A capacitor dielectric layer conforms to a surface of the first capacitor electrode and a second capacitor electrode is disposed on the capacitor dielectric layer opposite the first capacitor electrode. Sidewalls of the ohmic pattern, the barrier pattern and the pad portion of the contact plug may be substantially coplanar, and the device may further include an etch stopper layer conforming to at least sidewalls of the ohmic pattern, the barrier pattern and the pad portion of the contact plug. Related fabrication methods are described.

28 Claims, 12 Drawing Sheets

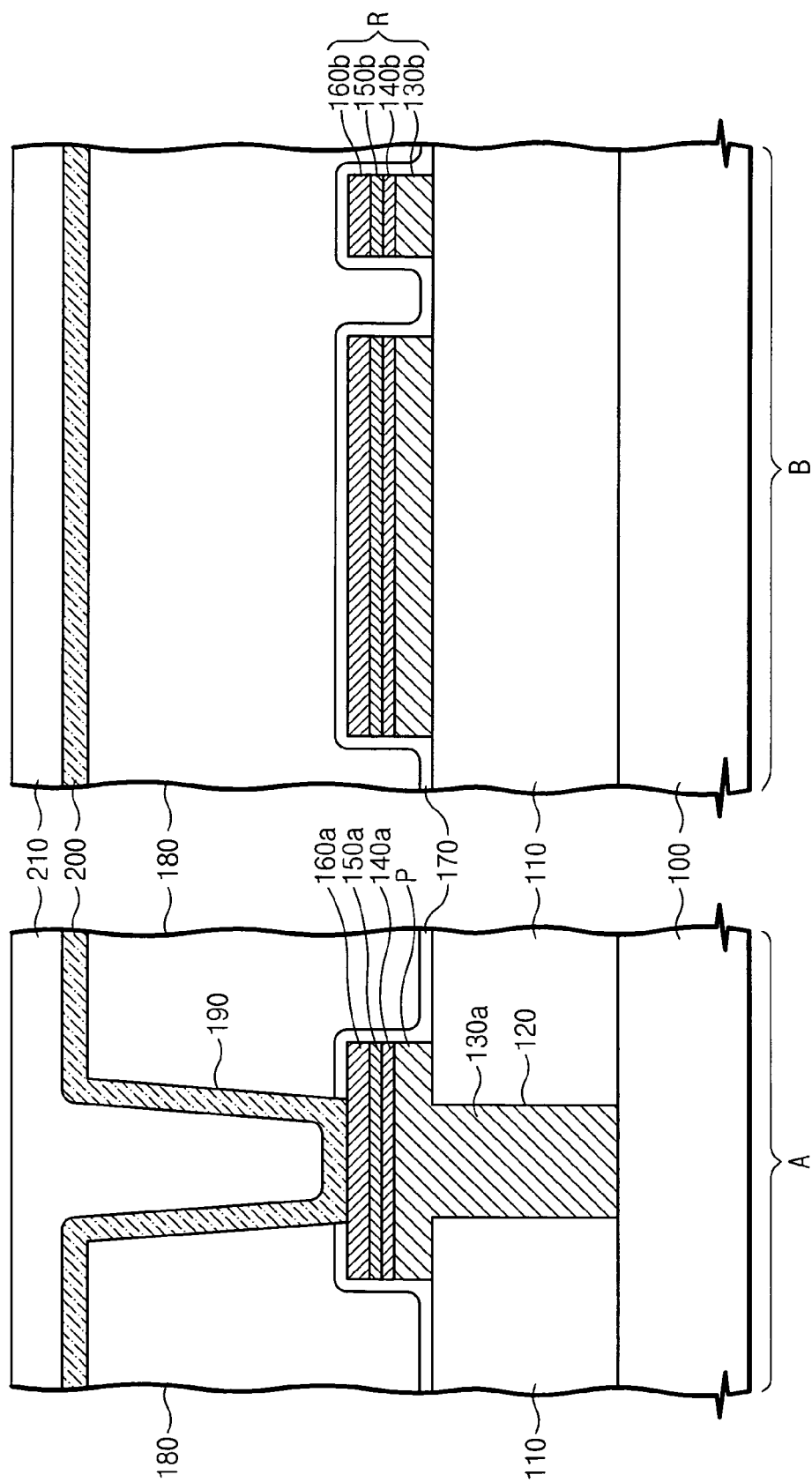

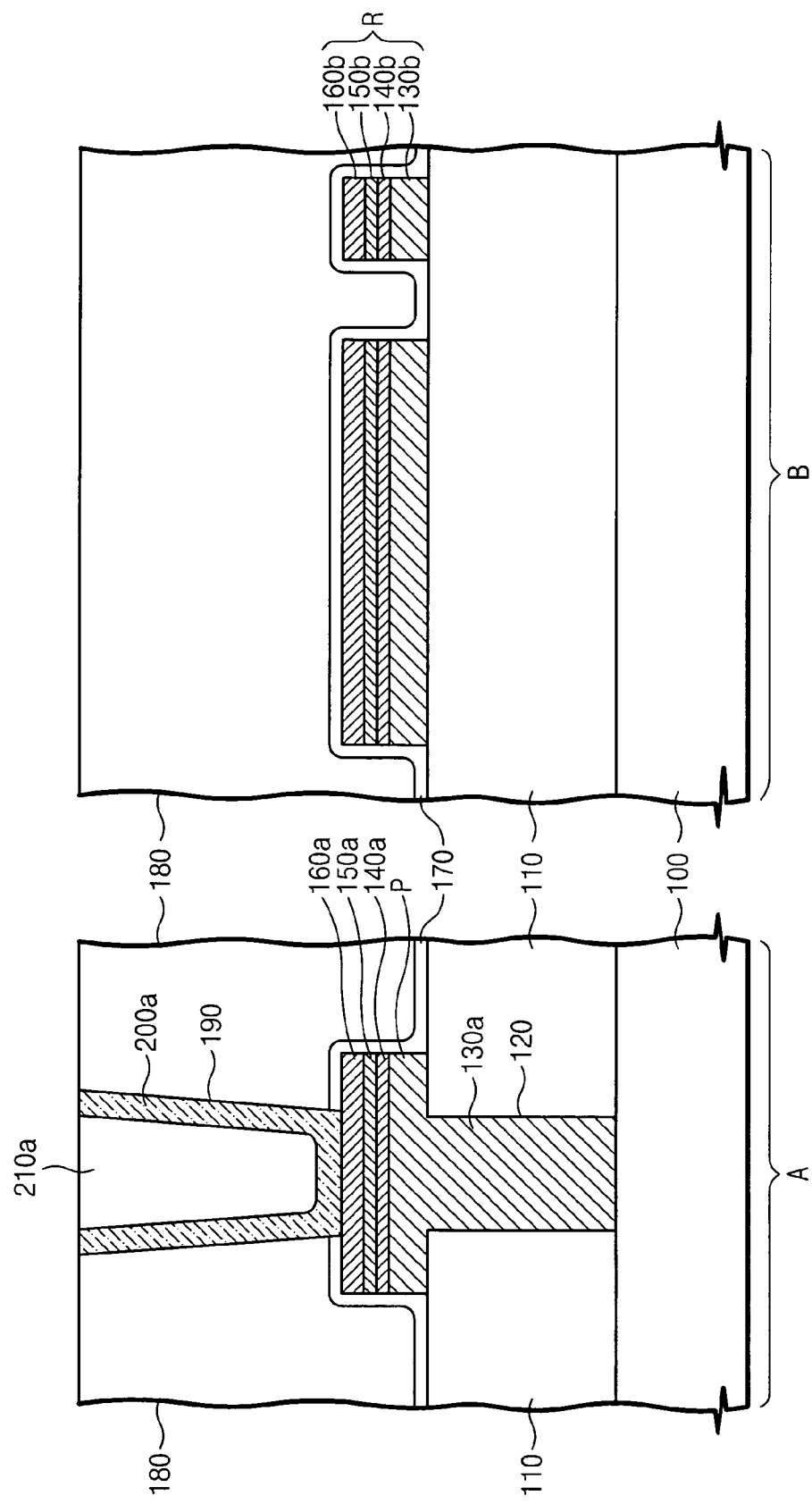

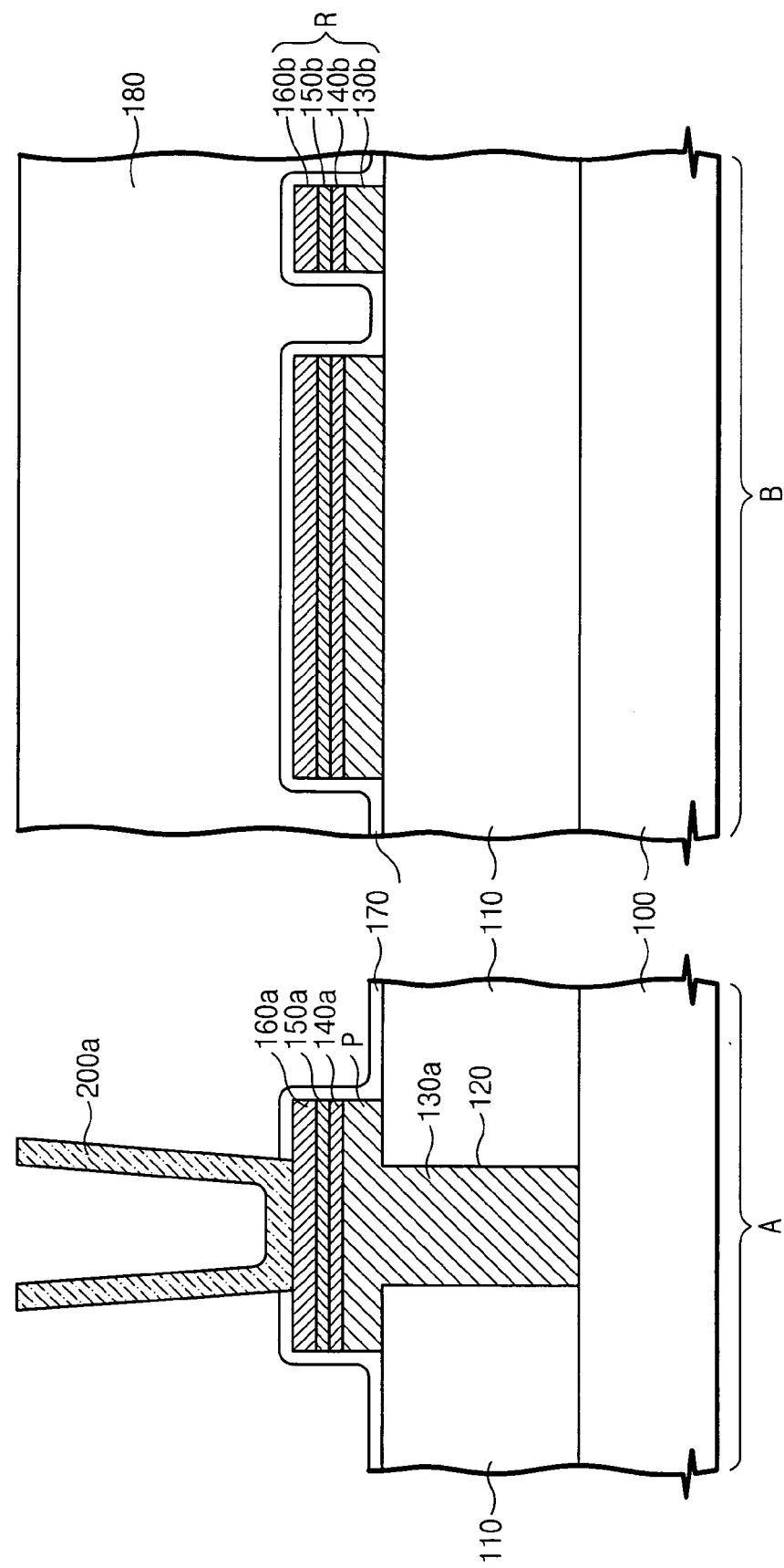

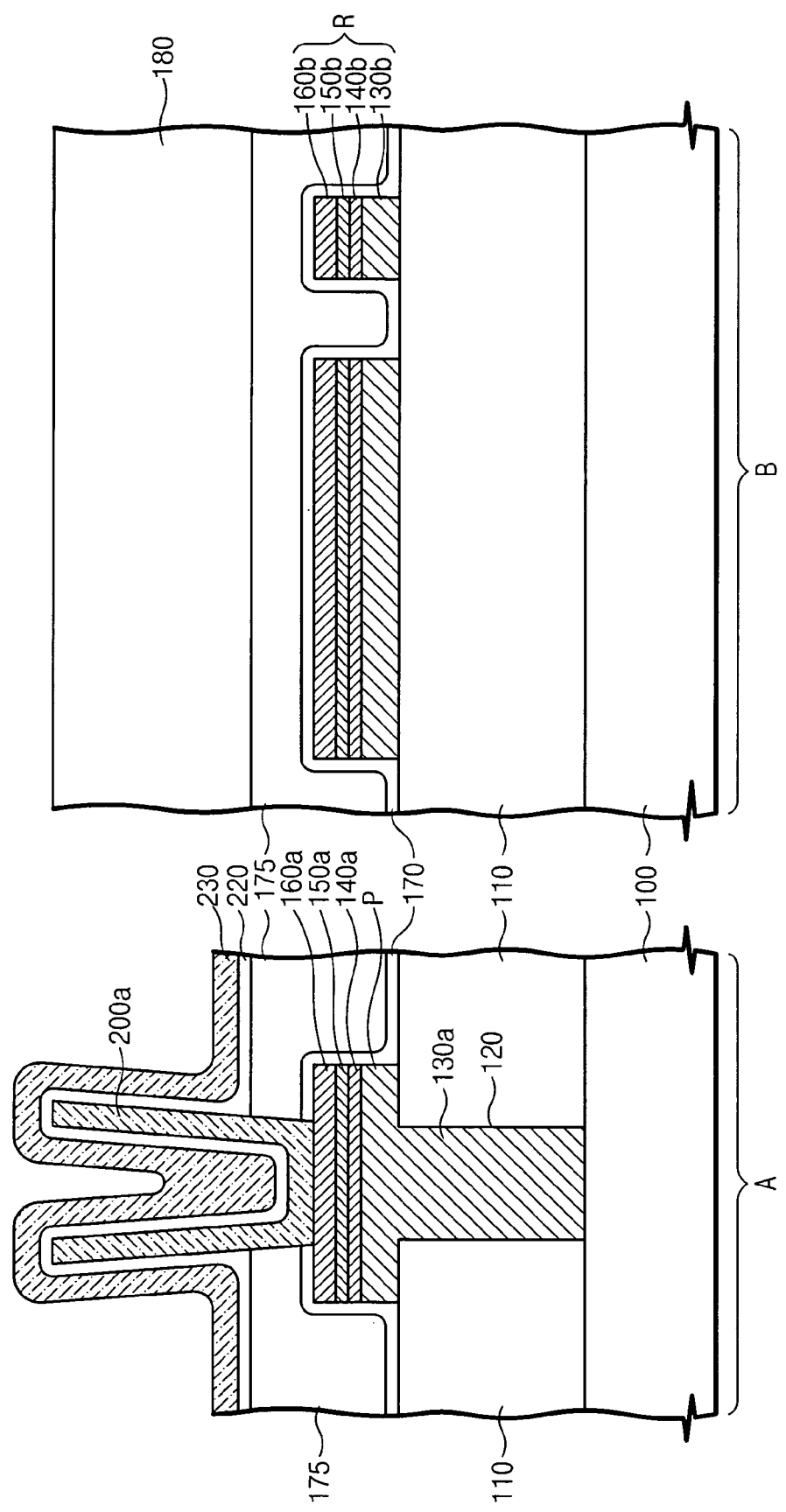

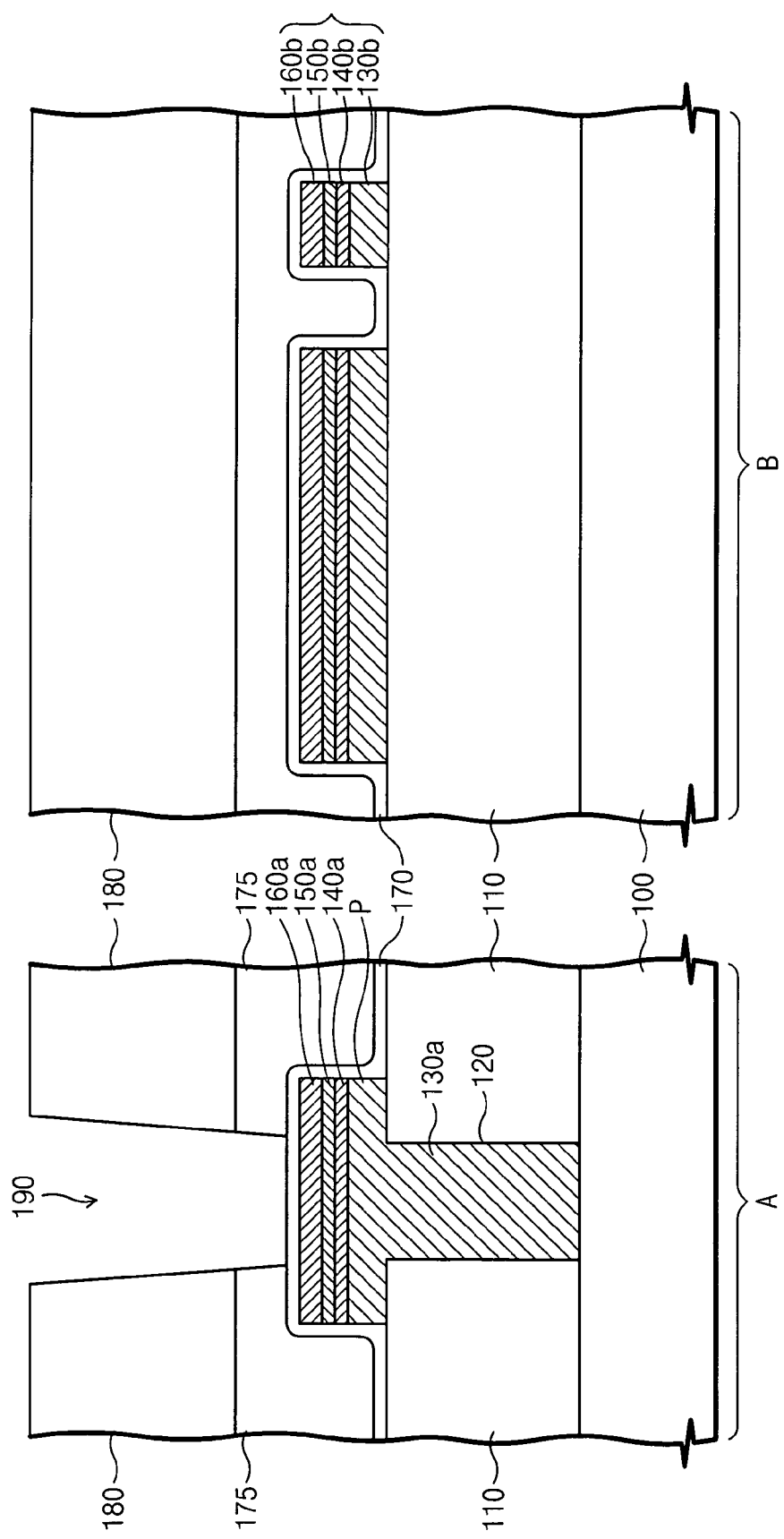

INTEGRATED CIRCUIT DEVICES WITH METAL-INSULATOR-METAL CAPACITORS

RELATED APPLICATION

This application claims priority under 35 U.S.C. §119 to Korean Patent Application 10-2003-0042171 filed on Jun. 26, 2003, the contents of which are herein incorporated by reference in their entirety.

BACKGROUND OF THE INVENTION

The present invention relates to integrated circuit devices and methods of forming the same, and more particularly, to integrated circuit devices with capacitors and methods of forming the same.

As the level of integration in integrated circuit memory devices has increased, much research and development has been directed toward reducing effective cell area. In these efforts, the unit area available for capacitor formation has decreased, thus creating a need for increased capacitance per unit area.

There are several conventional techniques for obtaining sufficient capacitance. One technique is to modify the widely used cylinder structure to increase dielectric area. A second technique is to employ a dielectric layer having a high dielectric constant. For example, a conventional DRAM (dynamic random access memory) may employ a capacitor with an MIS (metal/insulator/silicon) or an MIM (metal/insulator/metal) structure with a dielectric layer including tantalum oxide ($Ta_2O_5$) or BST [$(Ba,Sr)TiO_3$] having a higher dielectric constant than a triple layer of oxide/nitride/oxide, which may be used as a dielectric layer of an SIS (silicon/insulator/silicon) structure. A third technique is to reduce the thickness of a dielectric layer using materials such as tantalum oxide.

An SIS or MIS structure employing polysilicon as an electrode material may be fabricated relatively easily. Additionally, an SIS or MIS structure can typically be fabricated using existing processes. However, when an electric field is applied to an SIS or MIS structure, a depletion area typically is formed in the polysilicon, and this depletion area and the insulator are connected parallel to each other, which can thereby decrease the entire capacitance. Additionally, when polysilicon layer is used as a bottom electrode in the structure, an oxide may form at a surface of the bottom electrode of the polysilicon, which can increase the total thickness of the dielectric layer. This can decrease the total capacitance.

However, in a conventional MIM structure that employs metal electrodes, there typically is neither formation of a depletion layer nor a decrease of capacitance due to the depletion layer. Additionally, a typical MIM structure is typically less vulnerable to electrode oxidation. However, an MIM structure may be difficult to fabricate using existing processes.

A typical DRAM device having an MIM structure includes a buried contact plug that connects the capacitor of the MIM structure to a transistor on a semiconductor substrate. The buried contact plug is typically formed of polysilicon, because polysilicon generally has a superior gap-fill characteristic and because resistance of polysilicon can generally be easily controlled. When a DRAM device includes a buried contact plug of polysilicon and a capacitor having an MIM structure, the DRAM device typically also includes an ohmic layer that is used to overcome resistance between the polysilicon and the metal. Additionally, the DRAM device may employ a barrier layer in order to prevent the buried contact plug from being oxidized. However, conventional processes for forming the ohmic layer and the barrier layer between the buried contact plug and the metal bottom electrode may be complex, involving recess and planarization steps.

SUMMARY OF THE INVENTION

According to some embodiments of the present invention, an integrated circuit device includes a microelectronic substrate and a dielectric layer on the substrate. A conductive contact plug extends through an opening in the dielectric layer to contact the substrate and includes a widened pad portion extending onto the dielectric layer adjacent the opening. An ohmic pattern is disposed on the pad portion of the plug, and a barrier pattern is disposed on the ohmic pattern. A concave first capacitor electrode is disposed on the barrier pattern and defines a cavity opening away from the substrate. A capacitor dielectric layer conforms to a surface of the first capacitor electrode and a second capacitor electrode is disposed on the capacitor dielectric layer opposite the first capacitor electrode. Sidewalls of the ohmic pattern, the barrier pattern and the pad portion of the contact plug may be substantially coplanar, and the device may further include an etch stopper layer conforming to at least sidewalls of the ohmic pattern, the barrier pattern and the pad portion of the contact plug. A metal etch stopper pattern may be interposed between the first capacitor electrode and the barrier pattern.

In further embodiments of the present invention, an integrated circuit device includes a microelectronic substrate and a dielectric layer on the substrate. A conductive contact plug extends through an opening in the dielectric layer to contact the substrate and includes a widened pad portion extending onto the dielectric layer adjacent the opening. Stacked ohmic and barrier patterns are disposed on the pad portion of the plug and have sidewalls substantially coplanar with a sidewall of the pad portion. A first capacitor electrode disposed on the barrier pattern, a capacitor dielectric layer is disposed on the first capacitor electrode, and a second capacitor electrode is disposed on the capacitor dielectric layer opposite the first capacitor electrode.

According to some method embodiments of the present invention, a dielectric layer is formed on a substrate, and a conductive contact plug, ohmic pattern and a barrier pattern are formed, wherein the ohmic pattern and the barrier pattern are disposed on a widened pad portion of the plug that extends on to the dielectric layer. A concave first capacitor electrode is formed on the barrier pattern and defines a cavity opening away from the substrate. A capacitor dielectric layer is formed conforming to a surface of the first capacitor electrode, and a second capacitor electrode is formed on the capacitor dielectric layer opposite the first capacitor electrode.

The conductive contact plug, ohmic pattern and barrier pattern may be formed by forming the opening in the dielectric layer, forming a conductive layer on the dielectric layer and in the opening, forming an ohmic layer on the conductive layer, forming a barrier layer on the ohmic layer, forming a metal etch stopper layer on the barrier layer, forming a mask on the metal etch stopper layer, and etching the metal etch stopper layer, the barrier layer, the ohmic layer and the conductive layer using the mask to form the conductive contact plug, the ohmic pattern on the pad portion of the contact plug, the barrier pattern on the ohmic pattern, and a metal etch stopper pattern on the barrier pattern. The concave first capacitor electrode may be formed by forming an etch stopper layer conforming to the metal etch stopper pattern, the barrier pattern, the ohmic pattern and the pad portion of the contact plug, forming a mold layer on the etch stopper layer, etching the mold layer to form an opening therein using the etch stopper layer as an etching stopper, extending the opening through the etch stopper layer by etching the exposed portion of the etch stopper layer using the metal etch stopper pattern as an etching stopper, forming a conductive layer on the mold layer and conforming to a sidewall of the opening through the mold layer and the etch stopper layer and the exposed portion of the metal etch stopper pattern, and planarizing to form the first capacitor electrode.

In further method embodiments, a dielectric layer is formed on a substrate. A conductive plug having a widened pad portion and stacked ohmic and barrier patterns disposed on the widened pad portion of the plug and having sidewalls substantially coplanar with a sidewall of the pad portion are formed. A first capacitor electrode is formed on the barrier pattern, a capacitor dielectric layer is formed on the first capacitor electrode, and a second capacitor electrode is formed on the capacitor dielectric layer opposite the first capacitor electrode.

BRIEF DESCRIPTION OF THE DRAWINGS

FIGS. 2 through 10 are cross-sectional views showing exemplary operations for forming the semiconductor device of FIG. 1.

FIG. 11 is a cross-sectional view of a semiconductor device according to further another embodiments of the present invention.

FIG. 12 is a cross-sectional view showing operations for forming the semiconductor device of FIG. 11.

DETAILED DESCRIPTION OF EXEMPLARY EMBODIMENTS

Figure 1:
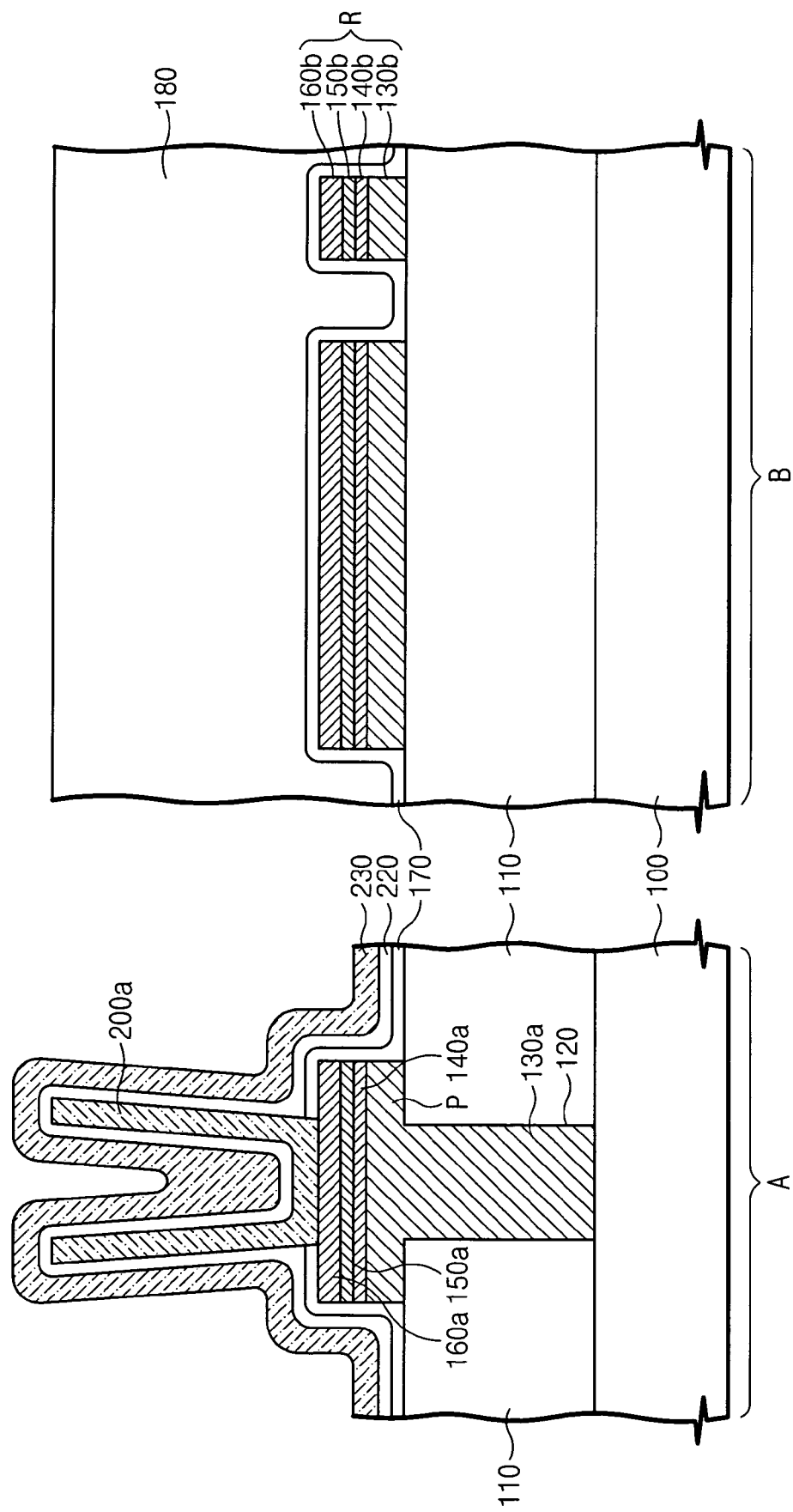
FIG. 1 is a cross-sectional view of a semiconductor device according to some embodiments of the present invention.

The present invention now will be described more fully hereinafter with reference to the accompanying drawings, in which typical and exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present. Furthermore, relative terms, such as "beneath", may be used herein to describe one element's relationship to another elements as illustrated in the drawings. It will be understood that relative terms are intended to encompass different orientations of the device in addition to the orientation depicted in the drawings. For example, if the device in the drawings is turned over, elements described as "below" other elements would then be oriented "above" the other elements. The exemplary term "below", therefore, encompasses both an orientation of above and below.

It will be understood that although the terms "first" and "second" are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. Like numbers refer to like elements throughout. In the following description, a reference letter "A" indicates a cell array region and another reference letter "B" indicates a peripheral circuit region.

FIG. 1 is a cross-sectional view of a semiconductor device according to first embodiments of the present invention. Referring to FIG. 1, a plurality of gate patterns (not shown) is disposed on a semiconductor substrate 100. A plurality of field oxide layers (not shown) is disposed at the semiconductor substrate 100 to define active regions. Impurity-doped regions (not shown) are in the active regions. An interlayer dielectric layer 110 is disposed on the semiconductor substrate 100 and a contact hole 120 exposes the impurity-doped region (not shown) in the semiconductor substrate 100 through the interlayer dielectric layer 110. The interlayer dielectric layer 110 may include at least one material from a group including HSQ (Hydrogen Silsesquioxane), BPSG (Boron Phosphorus Silicate Glass), HDP (High density plasma) oxide, PETEOS (plasma enhanced tetraethyl orthosilicate), USG (Undoped Silicate Glass), PSG(Phosphorus Silicate Glass), PE(plasma-enhanced)-$SiH_4$ and $Al_2O_3$. Although not illustrated in FIG. 1, self-aligned contacts (SAC) are present between the gate patterns and the contact hole 120 may expose the self-aligned contacts.

At the cell array region A, a stud-shape buried contact plug 130a fills the contact hole 120 and has a pad portion P protruding from the interlayer dielectric layer 110 and wider than the contact hole 120. The buried contact plug 120 is electrically connected to the impurity-doped region (not shown) in the semiconductor substrate 100. The stud-shape buried contact plug 130a may include polysilicon, doped or undoped. An ohmic pattern 140a, a barrier pattern 150a and a metal etch stopper pattern 160a are stacked on the pad portion P and aligned with the pad portion P. The ohmic pattern 140a may include titanium silicide ($TiSi_x$). The barrier pattern 150a may include at least one material from a group including titanium nitride (TiN), tantalum nitride (TaN), tantalum aluminum nitride (TaAlN) and titanium aluminum nitride (TiAlN). The metal etch stopper pattern 160a may include at least one material from a group including tungsten (W), aluminum (Al), copper (Cu), titanium nitride (TiN), tantalum nitride (TaN), tungsten nitride (WN), ruthenium (Ru), platinum (Pt), iridium (Ir), osmium (Os), rhodium (Rh), cobalt (Co) and nickel (Ni). At the peripheral circuit region B, a conductive pattern 130b, an ohmic pattern 140b, a barrier pattern 150b and a metal etch stopper pattern 160b are stacked on the interlayer dielectric layer 110 and form a resistor R.

At the cell array region A, an etch stopper 170 conforms to the upper surface and sidewall of the metal etch stopper pattern 160a, the sidewall of the barrier pattern 150a, the sidewall of the ohmic pattern 140a and the sidewall of the pad portion P of the stud-shape buried contact plug 130a. The etch stopper 170 covers the resistor R at the peripheral circuit region B. The etch stopper 170 may include silicon nitride ($Si_3N_4$) and/or tantalum oxide ($Ta_2O_5$). A concave bottom electrode 200a is electrically connected to the stud-shape buried contact plug 130a through the etch stopper 170. The electrode 200a defines a cavity that opens away from the substrate 100. A dielectric layer 220 and an upper electrode 239 cover the bottom electrode 200a and the etch stopper 170. The bottom electrode 200a and the upper electrode 230 may include at least one material from a group including titanium nitride (TiN), tantalum nitride (TaN), tungsten nitride (WN), ruthenium (Ru), platinum (Pt), iridium (Ir), osmium (Os), rhodium (Rh), cobalt (Co) and nickel (Ni). A mold layer 180 may protect the resistor R at the peripheral circuit region B.

In exemplary embodiments described below, because the buried contact plug 130a has a shape of stud with a pad portion P, it is possible to form the buried contact plug 130a, the metal etch stopper pattern 160a, the barrier pattern 150a, the ohmic pattern 140a and a resistor in the peripheral region B in the same patterning operation, e.g., by etching using a mask such that sidewalls of the pad portion P of the buried contact plug 130a, the metal etch stopper pattern 160a, the barrier pattern 150a, and the ohmic pattern 140a are substantially coplanar. A desirable process margin can be obtained due to the pad portion P having a greater width than the rest of the buried contact plug 130a.

Figure 2:
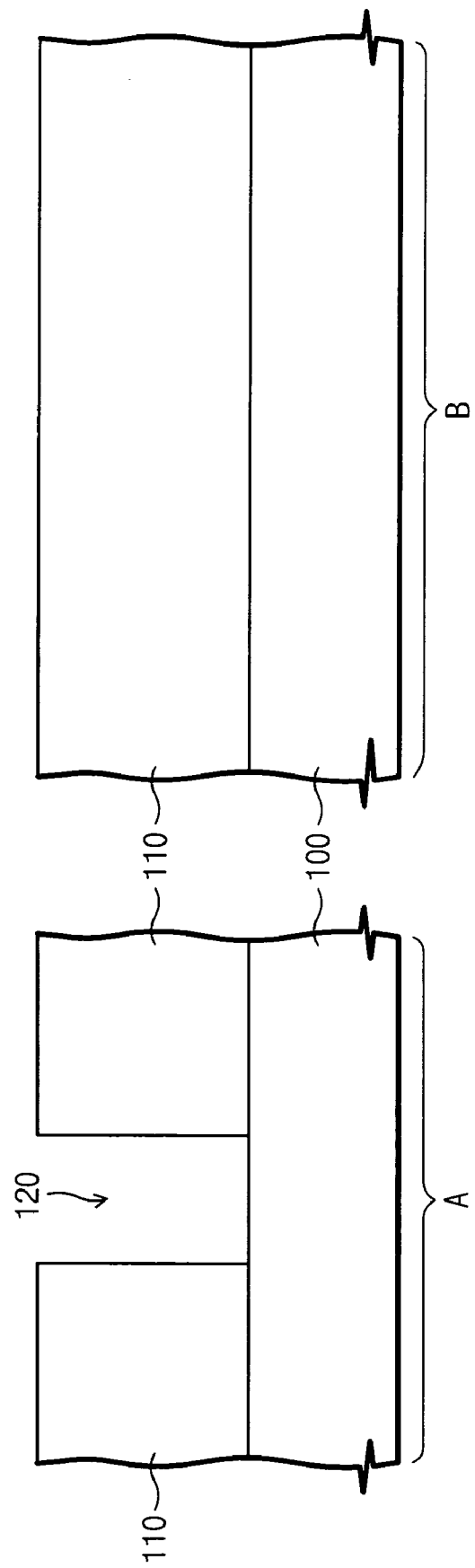

FIGS. 2 through 10 are cross-sectional views illustrating exemplary operations for forming the semiconductor device of FIG. 1. Referring to FIG. 2, an interlayer dielectric layer 110 is formed on a semiconductor substrate 100. Before forming the interlayer dielectric layer 110, a plurality of field oxide layers (not shown) may be formed on and/or in the semiconductor substrate 100 having the cell array region A and the peripheral circuit region B to define active regions. Gate patterns (not shown) may be formed to cross over the active regions. Impurity-doped regions (not shown) may be formed in the active regions adjacent the gate patterns. Self-aligned contacts (not shown) may be formed on the impurity-doped regions between the gate patterns.

The interlayer dielectric layer 110 is patterned to form a contact hole 120 exposing the impurity-doped region in the semiconductor substrate 100 at the cell array region A. The contact hole 120 may expose the self-aligned contact. The interlayer dielectric layer 110 may be formed of a single layer or multiple layers including at least one material from a group including HSQ, BPSG, HDP oxide, PETEOS, USG, PSG, PE-SiH$_4$ and Al$_2$O$_3$.

Figure 3:
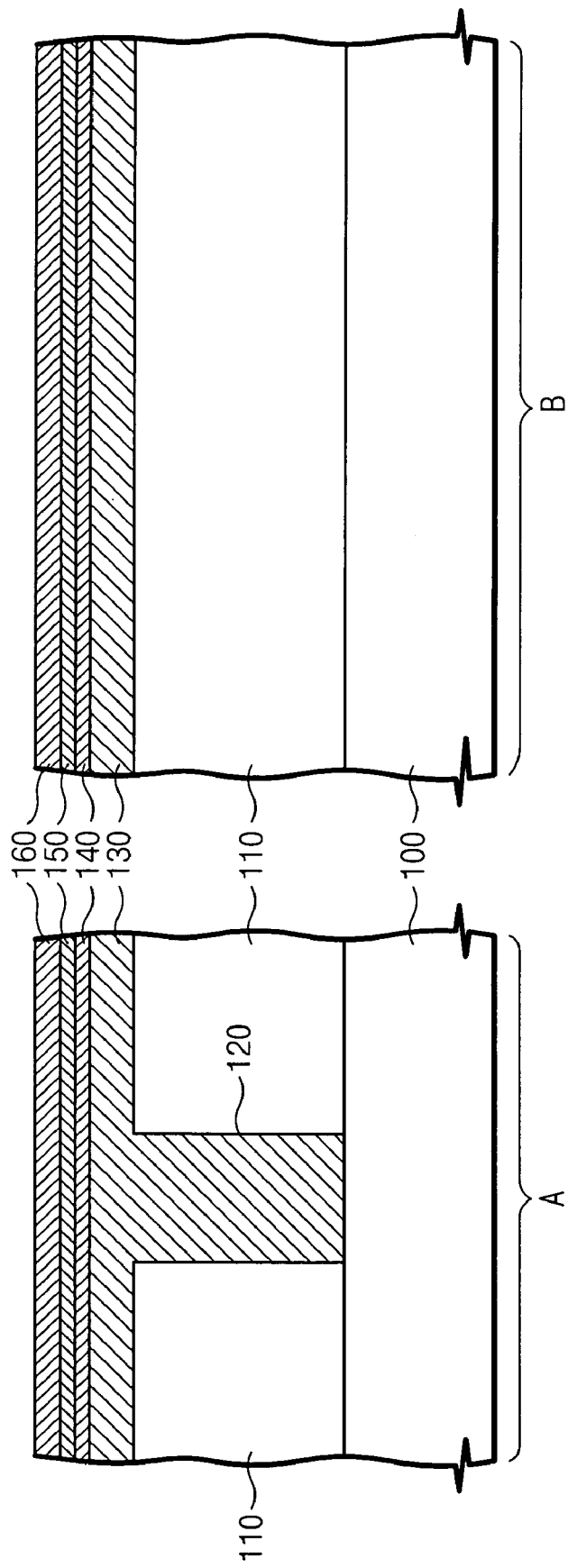

Referring to FIG. 3, a conductive layer 130 is formed on the interlayer dielectric layer 110 to fill the contact hole 120. The conductive layer 130 may be formed of a polysilicon, doped or undoped. An ohmic layer 140, a barrier layer 150 and a metal etch stopper layer 160 are sequentially formed on the conductive layer 130. The ohmic layer 140 may be formed of titanium silicide. In order to form the ohmic layer 140, a titanium layer may be formed by, for example, a sputtering or a physical vapor deposition (PVD) method and an annealing process may be performed with respect to the titanium layer at a temperature of about 600~700° C. in nitrogen-enriched ambient. Alternatively, a titanium layer may be formed by a chemical vapor deposition (CVD) or an atomic layer deposition (ALD) at a temperature of about 600~800° C. to form the ohmic layer 140 of a titanium silicide at the surface of the conductive layer 130 of the polysilicon. The barrier layer 150 may be formed of at least one material from a group including titanium nitride, tantalum nitride, tantalum aluminum nitride and titanium aluminum nitride. The metal etch stopper layer 160 may be formed of at least one material from a group including tungsten, aluminum, copper, titanium nitride, tantalum nitride, tungsten nitride, ruthenium, platinum, iridium, osmium, rhodium, cobalt and nickel.

Figure 4:
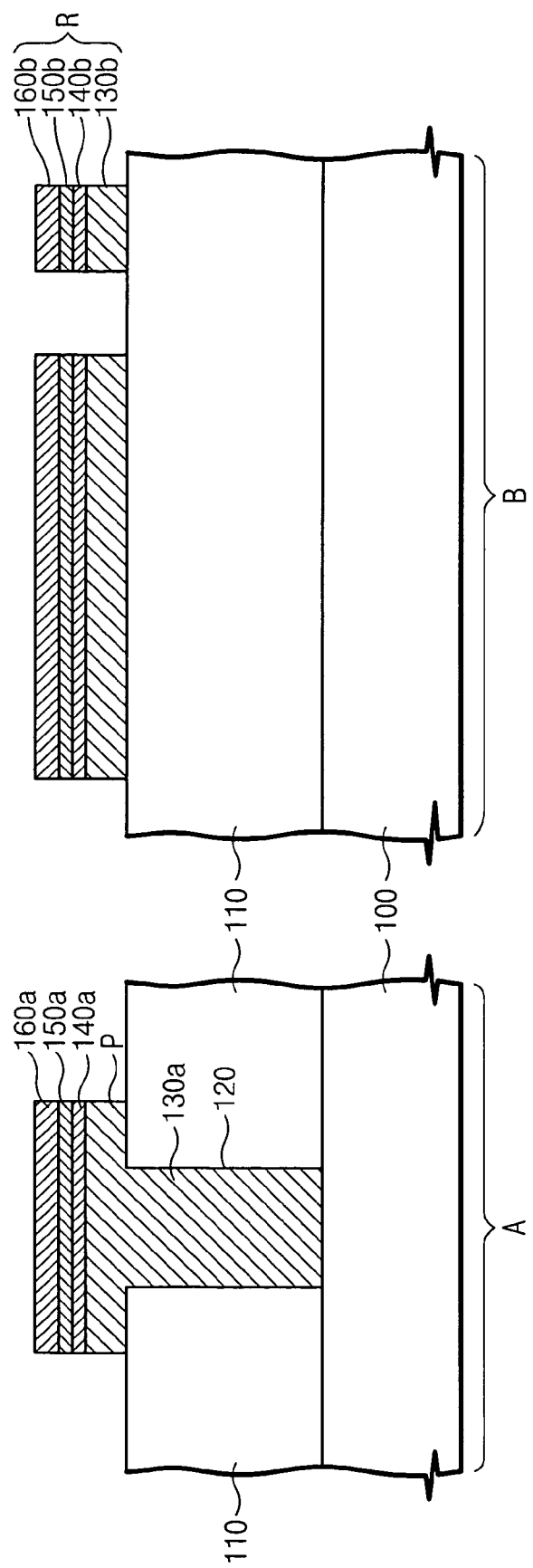

Referring to FIG. 4, the metal etch stopper layer 160, the barrier layer 150, the ohmic layer 140 and the conductive layer 130 are patterned to form a stud-shape buried contact plug 130a having a pad portion P, an ohmic pattern 140a, a barrier pattern 150a and a metal etch stopper pattern 160a at the cell array region A. A conductive pattern 130b, an ohmic pattern 140b, a barrier pattern 150b and a metal etch stopper pattern 160b form a resistor R at the peripheral circuit region B. The stud-shape buried contact plug 130a and the conductive pattern 130b are formed from the conductive layer 130. The ohmic pattern 140a functions to decrease contact resistance between the barrier pattern 150a and the polysilicon contact plug 130a. The barrier pattern 150a inhibits penetration of oxygen and/or hydrogen into the contact plug 130a. The metal etch stopper pattern 160a acts as an etch stopper when a storage node hole for a bottom electrode is formed, as described in greater detail below.

Figure 5:
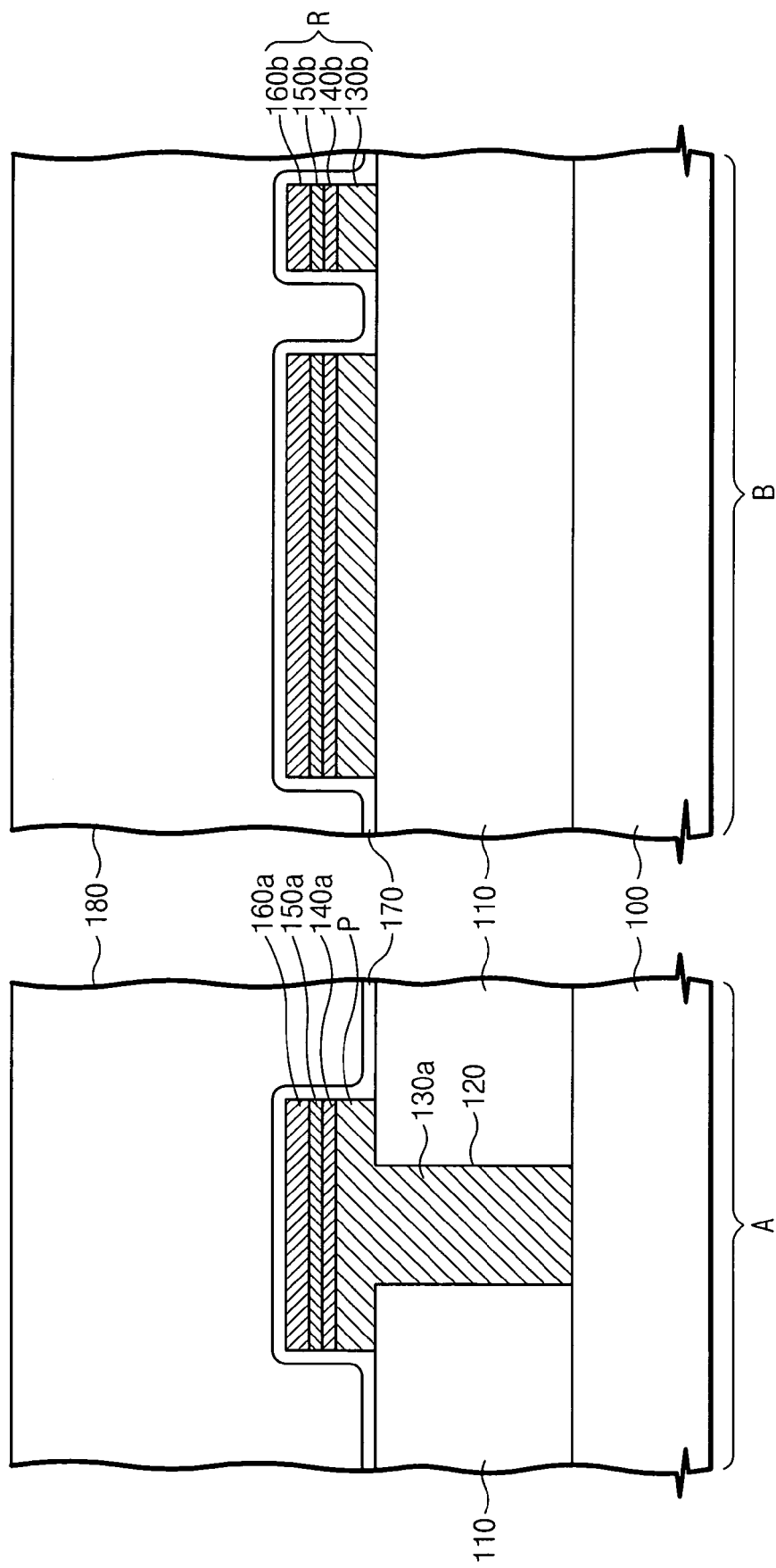
Figure 6:
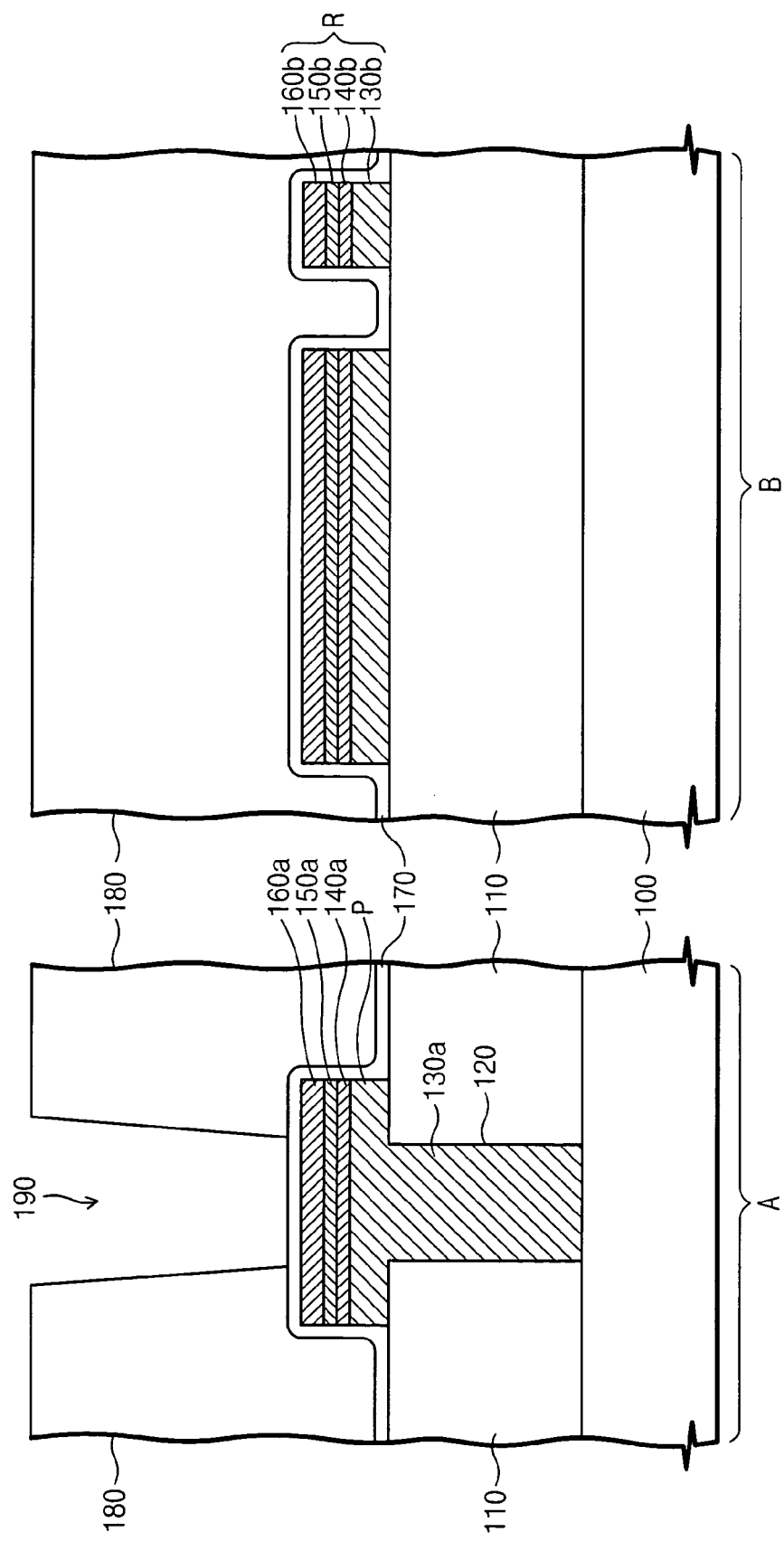

Referring to FIG. 5, an etch stopper is formed on the semiconductor substrate 100. The etch stopper 170 may include, for example, silicon nitride or tantalum oxide. A mold layer 180 is formed on the etch stopper 170. The mold layer 180 may be formed of at least one material selected from a group including HSQ, BPSG, HDP oxide, PETEOS, USG, PSG, PE-SiH$_4$ and Al$_2$O$_3$. Referring to FIG. 6, the mold layer 180 and the etch stopper 170 are patterned to form a storage node hole 190 exposing the metal etch stopper pattern 160a at the cell array region A.

Figure 7:
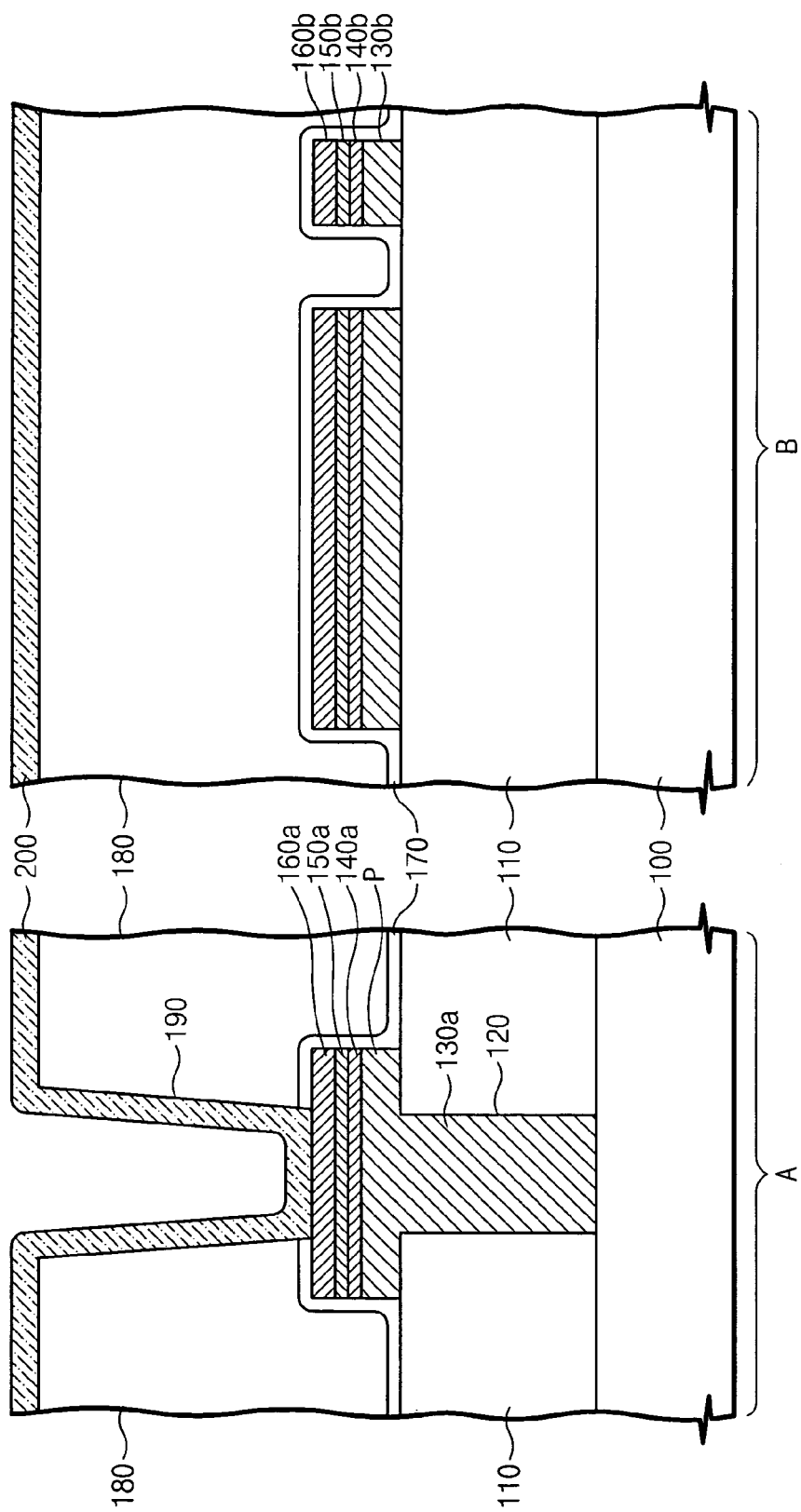

Referring to FIG. 7, a bottom electrode layer 200 is formed on the surface of the interlayer dielectric layer 180 having the storage node hole 190. The bottom electrode layer 200 may be formed of at least one material from a group including titanium nitride, tantalum nitride, tungsten nitride, ruthenium, platinum, iridium, osmium, rhodium, cobalt and nickel. Referring to FIG. 8, a sacrificial layer 210 is formed on the bottom electrode layer 200. The sacrificial layer 210 may be formed of, for example, HSQ by an SOG (Spin on Glass) process.

Referring to FIG. 9, a planarization process, such as chemical mechanical polishing (CMP), is performed with respect to the sacrificial layer 210 and the bottom electrode layer 200, thereby removing the sacrificial layer 210 and the bottom electrode layer 200 on the mold layer 180 and exposing the mold layer 180. As a result, a bottom electrode 200a and a sacrificial pattern 210a remain in the storage node hole 190.

Referring to FIG. 10, the sacrificial pattern 210a and the mold layer 180 in the bottom electrode 200a are removed using, for example, a solution including fluoric acid (HF). If the sacrificial pattern 210a and the mold layer 180 are formed of the same material, the layers 210a and 180 can be simultaneously removed. Thus, a bottom electrode 200a remains to connect with the metal etch stopper pattern 160a through the etch stopper 170. At the peripheral circuit region B, the mold layer 180 may remain to protect the resistor R.

Referring again to FIG. 1, a dielectric layer (220 of FIG. 1) and an upper electrode (230 of FIG. 1) are formed to create a capacitor. The dielectric layer may be formed of Ta$_2$O$_5$ or of a ferroelectric material, such as BST [(Ba,Sr)TiO$_3$] or PZT [Pb(Zr,Ti)O$_3$]. The upper electrode may be formed of the same material as the bottom electrode. The upper electrode layer 230 is removed at the peripheral circuit region B as illustrated in FIG. 1.

According to the above-described operations, the buried contact plug 130a of polysilicon is formed to have a shape of a stud having a pad portion P, and the ohmic pattern 140a is formed on the pad portion P on the interlayer dielectric layer 110. Thus, a conventional recess process is not required, which can simplify the overall fabrication process. Additionally, because the pad portion P and the resistor R may be simultaneously formed with the buried portion of the contact plug 130a, the overall fabrication process can be simplified and a desirable process margin can be obtained.

FIG. 11 is a cross-sectional view of a semiconductor device according to second embodiments of the present invention. Referring to FIG. 11, a support layer 175 is interposed between the dielectric layer 220 and the etch stopper 170 to support the bottom electrode 130a. The support layer 175 may include at least one material from a group including HSQ, BPSG, HDP oxide, PETEOS, USG, PSG, PE-SiH$_4$ and Al$_2$O$_3$. The other components apart from the support layer 175 may be identical to those described above with reference to FIG. 1.

FIG. 12 is a cross-sectional view illustrating exemplary operations for forming the semiconductor device of FIG. 11. Referring to FIG. 12, which corresponding to the fabrication state of FIG. 4, a support layer 175 and a mold layer 180 are sequentially formed and patterned to form a storage node hole 190. The support layer 175 may be formed of a material having an etch selectivity with respect to the mold layer 180. The support layer 175 may be formed of at least one material from a group including HSQ, BPSG, HDP oxide, PETEOS, USG, PSG, PE-SiH$_4$ and Al$_2$O$_3$. If the support layer 175 is formed of the same material as the mold layer 180, an etch stopper (not shown) may be formed on the support layer 175. Subsequent steps may be identical to those described above with reference to FIGS. 4–10.

As discussed above with respect to FIGS. 1 through 12, semiconductor devices and related methods according to embodiments of the present invention provide a stud-shaped buried contact plug having a pad portion and ohmic and barrier patterns disposed on the pad portion. Therefore, a conventional recess process is not required, which can simplify the overall fabrication process. Additionally, because the contact plug, barrier pattern, ohmic pattern and peripheral resistor can be formed in the same patterning operation, the overall fabrication process can be simplified and a desirable process margin can be obtained.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. An integrated circuit device comprising:
a microelectronic substrate;
a dielectric layer on the substrate;
a conductive contact plug extending through an opening in the dielectric layer to contact the substrate and including a widened pad portion extending onto the dielectric layer adjacent the opening;
an ohmic pattern on the pad portion of the plug;
a barrier pattern on the ohmic pattern;
a concave first capacitor electrode disposed on the barrier pattern and defining a cavity opening away from the substrate;
a capacitor dielectric layer conforming to a surface of the first capacitor electrode; and
a second capacitor electrode disposed on the capacitor dielectric layer opposite the first capacitor electrode.

2. A device according to claim 1, wherein sidewalls of the ohmic pattern, the barrier pattern and the pad portion of the contact plug are substantially coplanar.

3. A device according to claim 2, comprising an etch stopper layer conforming to at least sidewalls of the ohmic pattern, the barrier pattern and the pad portion of the contact plug.

4. A device according to claim 3, wherein the etch stopper layer also overlies a top surface of the barrier pattern.

5. A device according to claim 3, wherein the etch stopper layer comprises a dielectric material having an etch selectivity with respect to at least material of a group including Hydrogen Silsesquioxane (HSQ), Boron Phosphorus Silicate Glass (BPSG), High density plasma (HDP) oxide, plasma enhanced tetraethyl orthosilicate (PETEOS), Undoped Silicate Glass (USG), Phosphorus Silicate Glass (PSG), plasma-enhanced (PE)-SiH$_4$ and aluminum oxide (Al$_2$O$_3$).

6. A device according to claim 5, wherein the etch stopper layer comprises at least one material from a group including silicon nitride (Si$_3$N$_4$) and tantalum oxide (Ta$_2$O$_5$).

7. A device according to claim 1, wherein the contact plug comprises polysilicon.

8. A device according to claim 1, wherein the ohmic pattern comprises titanium silicide (TiSi$_x$).

9. A device according to claim 1, wherein the barrier pattern comprises at least one material from a group including titanium nitride (TiN), tantalum nitride (TaN), tantalum aluminum nitride (TaAlN) and titanium aluminum nitride (TiAlN).

10. A device according to claim 1, wherein the first electrode and the second electrode each comprise at least one material from a group including titanium nitride (TiN), tantalum nitride (TaN), tungsten nitride (WN), ruthenium (Ru), platinum (Pt), iridium (Ir), osmium (Os), rhodium (Rh), cobalt (Co) and nickel (Ni).

11. A device according to claim 1, further comprising a metal etch stopper pattern interposed between the first capacitor electrode and the barrier pattern.

12. A device according to claim 1, further comprising a support layer disposed on the dielectric layer and laterally abutting a base of the concave first capacitor electrode.

13. An integrated circuit device comprising:
a microelectronic substrate;
a dielectric layer on the substrate;
a conductive contact plug extending through an opening in the dielectric layer to contact the substrate and including a widened pad portion extending onto the dielectric layer adjacent the opening;
stacked ohmic and barrier patterns disposed on the pad portion of the plug and having sidewalls substantially coplanar with a sidewall of the pad portion;
a first capacitor electrode disposed on the barrier pattern;
a capacitor dielectric layer on the first capacitor electrode; and
a second capacitor electrode on the capacitor dielectric layer opposite the first capacitor electrode.

14. A device according to claim 13, further comprising an etch stopper layer conforming to at least the sidewalls of the ohmic pattern, the barrier pattern and the pad portion of the contact plug.

15. A device according to claim 14, wherein the etch stopper layer also overlies a portion of the barrier pattern.

16. A device according to claim 14, wherein the etch stopper layer comprises a dielectric material having an etch selectivity with respect to at least one material from a group including Hydrogen Silsesquioxane (HSQ), Boron Phosphorus Silicate Glass (BPSG), High density plasma (HDP) oxide, plasma enhanced tetraethyl orthosilicate (PETEOS), Undoped Silicate Glass (USG), Phosphorus Silicate Glass (PSG), plasma-enhanced (PE)-$SiH_4$ and aluminum oxide ($Al_2O_3$).

17. A device according to claim 16, wherein the etch stopper layer comprises at least one material from a group including silicon nitride ($Si_3N_4$) and tantalum oxide ($Ta_2O_5$).

18. A device according to claim 13, wherein the contact plug comprises polysilicon.

19. A device according to claim 13, wherein the ohmic pattern comprises titanium silicide ($TiSi_x$).

20. A device according to claim 13, wherein the barrier pattern comprises at least one material from a group including titanium nitride (TiN), tantalum nitride (TaN), tantalum aluminum nitride (TaAlN) and titanium aluminum nitride (TiAlN).

21. A device according to claim 13, wherein the first electrode and the second electrode each comprise at least one material from a group including titanium nitride (TiN), tantalum nitride (TaN), tungsten nitride (WN), ruthenium (Ru), platinum (Pt), iridium (Ir), osmium (Os), rhodium (Rh), cobalt (Co) and nickel (Ni).

22. A device according to claim 13, further comprising a metal etch stopper pattern interposed between the first capacitor electrode and the barrier pattern.

23. A device according to claim 1, wherein a portion of the contact plug extending through the opening in the dielectric layer to contact the substrate and the widened pad portion form a continuous material region.

24. A device according to claim 23, wherein the continuous material region comprises polysilicon.

25. A device according to claim 13, wherein a portion of the contact plug extending through the opening in the dielectric layer to contact the substrate and the widened pad portion form a continuous material region.

26. A device according to claim 25, wherein the continuous material region comprises polysilicon.

27. A device according to claim 1, further comprising a resistor on the dielectric layer, wherein the resistor includes a first layer made of the same material as the conductive plug, a second layer made of the same material as the ohmic pattern, and a third layer made of the same material as the barrier pattern, sequentially stacked on the dielectric layer.

28. A device according to claim 13, further comprising a resistor on the dielectric layer, wherein the resistor includes a first layer made of the same material as the conductive plug, a second layer made of the same material as the ohmic pattern, and a third layer made of the same material as the barrier pattern, sequentially stacked on the dielectric layer.

* * * * *